United States Patent [19]

Atherton et al.

[11] Patent Number: 5,270,949
[45] Date of Patent: Dec. 14, 1993

[54] METHOD AND APPARATUS FOR DISPOSING A METER REGISTER IN A DEFAULT MODE

[75] Inventors: Kenneth W. Atherton, Saco, Me.; Susan D. Dastous, Milford; Gregory P. Lavoie, Lee, both of N.H.

[73] Assignee: General Electric Company, Schenectady, N.Y.

[21] Appl. No.: 764,852

[22] Filed: Sep. 24, 1991

[51] Int. Cl.$^5$ .................... G01B 7/00; G01M 19/00
[52] U.S. Cl. .................... 364/550; 364/483; 364/492; 324/103 R; 324/116; 324/142
[58] Field of Search .............. 364/483, 492; 235/144 ME; 324/103 R, 116, 142

[56] References Cited

U.S. PATENT DOCUMENTS

| | | | |
|---|---|---|---|
| 4,177,922 | 12/1979 | Hart et al. | 235/144 ME |
| 4,301,508 | 11/1981 | Anderson et al. | 364/492 |
| 4,335,447 | 6/1982 | Jerrim . | |
| 4,467,434 | 8/1984 | Hurley et al. | 324/103 R |
| 4,542,469 | 9/1985 | Brandyberry et al. | 364/492 |
| 4,594,545 | 6/1986 | Germer . | |
| 4,598,248 | 6/1986 | Germer . | |
| 4,959,607 | 9/1990 | Coryea et al. | 324/116 |
| 5,059,896 | 10/1991 | Germer et al. | 324/116 |

OTHER PUBLICATIONS

Sangamo Energy Management Division, Product Bulletin 10506, ST-Q100 Series, Electronic Meter, Effective Date Jun. 1987.
Sangamo Energy Management Division, Product Bulletin 10251, ST-Q120 Series, Electronic Meter, Effective Date Aug. 1987.
Sangamo Electricity Division, KV1 Multifunction Meter, Product Bulletin 10532, Effective Sep., 1989.
Scientific Columbus, JEM3, Sep. 1989.
Appalachian Technologies Corporation, SSM-SOT Four Quadrant, Time-of-Use Precision Meter, Oct. 1989.
APTECH, Inc., PFM-800 Series Multifunction Meters, Jan. 1991.
Process Systems Incorporated, The Quad 4 Solid State Meter Family, May 1991.
Trans Data, EMS 7000 Electronic Metering System with Demand Register, Publication Date Unknown, this copy obtained on May 14, 1991.
Trans Data, Inc. EMS 96 Electronic Metering System, Publication Date Unknown, this copy obtained on May 14, 1991.
ABB Type E1R Polyphase Solid-State Watthour/Varhour Meter, Sep. 1991.
Schlumberger Industries, Inc. Introducing FULCRUM Commercial/Industrial Meters, Mar. 1991.
Transmission & Distribution, May 1992, Universal Meter Introduced by ABB . . . .
Engineering presentation to AEIC/EEI Meter and Services Committees, Sep. 24, 1990, pp. 1–6.

Primary Examiner—Jack B. Harvey
Assistant Examiner—Hal D. Wachsman
Attorney, Agent, or Firm—Bell, Seltzer Park & Gibson

[57] ABSTRACT

An apparatus for disposing a meter register in a default mode of operation includes a microcontroller coupled to a programmable non-volatile memory for automatically disposing the meter register in a self-programmed state when the electrical meter containing the meter register is installed for the first time. The self-programmed state is a functional default state and provides a monitoring utility company with accurate customer billing information from the time of installation. Accordingly, a technician responsible for installing the meter in the field need not be familiar with the techniques for programming the meter. If a mode of operation other than the default mode of operation is preferred, the microcontroller can be accessed for disposing the meter in a time-of-use and demand mode of operation or a demand only mode of operation. The microcontroller also provides means for retaining a programmed state of the meter register in the event of a power outage. Thus, when power is again supplied to the meter after an outage, the meter register is again disposed in the last programmed state prior to power failure.

14 Claims, 2 Drawing Sheets

METHOD AND APPARATUS FOR DISPOSING A METER REGISTER IN A DEFAULT MODE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

I. BACKGROUND OF THE INVENTION

A. Field of the Invention

The present invention is generally related to meters, and more specifically, relates to disposing a meter register in a default mode.

B. Related Art

A meter register uses many operating parameters which may be altered by use of a programmed device to tailor the operation of the register to a specific application. As a result, there are thousands of possible configurations that can be obtained for a single register.

To simplify major changes in operation, it is advantageous to have a method and apparatus of returning the register to a state in which all the values of all the programmable parameters are in a default state. In known registers, this operation was accomplished by removal of AC and battery power.

Current generations of meter registers, however, utilize non-volatile memories in which programmable parameters may be preserved even in the absence of both AC and battery power. A need exists, therefore, for a method and apparatus for disposing such registers in a default state.

II. SUMMARY OF THE INVENTION

The present invention comprises means for mechanically initiating a meter register reset and means for resetting the register programmable parameters to default values upon initiation of the register reset. Particularly, in one embodiment, by mechanically depressing switches accessible from external the meter in a predetermined manner, register function bytes implemented in software are set to some unknown (RESET) value. Subsequent to mechanically depressing the switches, the register performs an initialization function. During the initialization operation, if the register function bytes do not match a predetermined set of values (i.e., a value for time-of-use and demand, demand only, or unprogrammed), then the programmable parameters of the register are set to default values.

The present invention does not require, in the one embodiment, the addition of any mechanical components to a commercially available meter register. Further, by utilizing a sufficient number of bytes for the register function bytes (in one embodiment, five (5) bytes are utilized), the odds of a match between the pre-determined value and the randomly set bytes is low (for five (5) bytes, the odds are 1099511627776:1).

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

Figure 1:
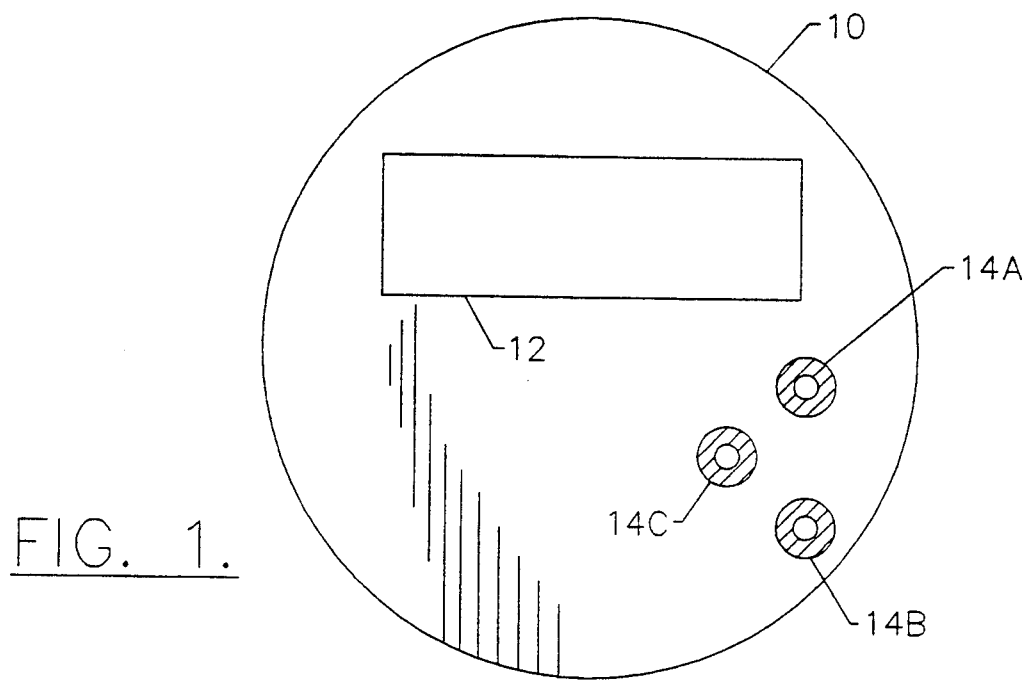
FIG. 1 view of a meter bezel.

Referring now to FIG. 1, a front view of a meter bezel 10 is shown. Mounted to the bezel 10 is a register display 12 such as a liquid crystal display (LCD), and three switches 14 A-C. The switch 14A is a reset switch, the switch 14B is the test switch, and the switch 14C is the display switch. Such a meter bezel is well-known in the art and commercially available, for example, from General Electric Company, Meter & Control Business Department, Somersworth, N.H.

Figure 2:
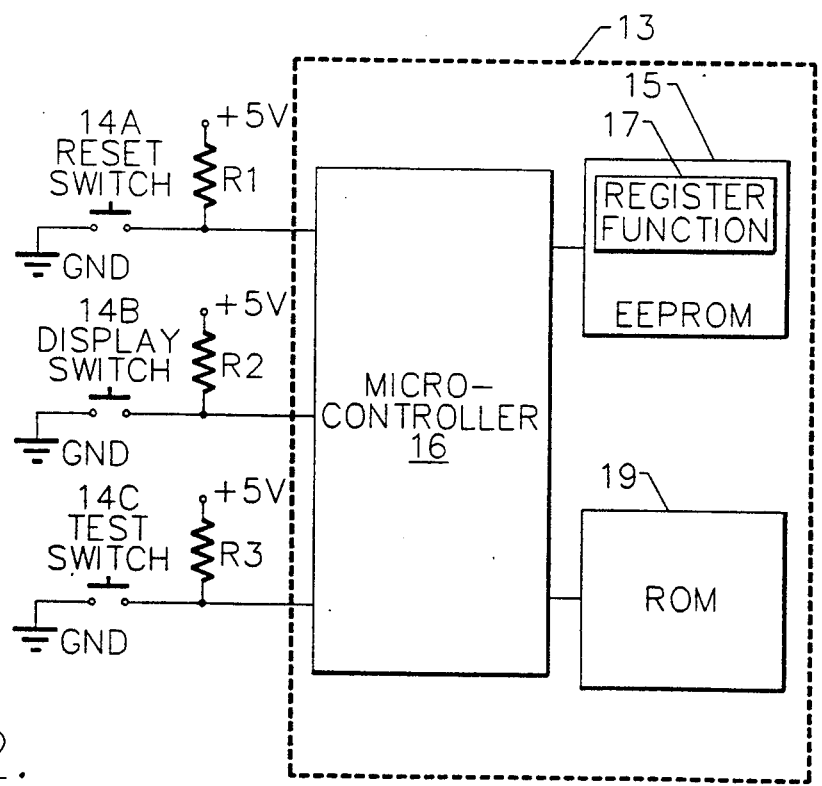
FIG. 2 is a block diagram illustration of the interconnection between the switches shown in FIG. 1 and the meter register.

As illustrated in FIG. 2, each switch 14 A-C is coupled to a register micro-controller 16. The switches 14 A-C, as shown, are biased open. Through a reference voltage (e.g., +5 V) and a resistor (R1-R3) network, when one of the switches 14 A-C is depressed, the micro-controller 16 receives a 0 V pulse input on a corresponding input pin. As is well-known in the art, for example, when the reset switch 14A is depressed, the micro-controller 16 causes "demand" values to be reset. Similar well-known operations are associated with the other switches.

In accordance with the present invention, and pre-stored in the memory 15 forming part of or coupled to the micro-controller 16, are five (5) bytes, collectively referred to as the register function 17, which are used by the micro-controller 16 to determine whether the register 13 has been programmed. Specifically, when the meter register 13 has been programmed, and as part of the programming operation, the register function 17 is set to a known, pre-determined value. At initialization after power-up, the register function 17 value is compared with the known values associated with respective modes of operation, and if the values do not match a recognized value, then the register 13 self-programs its non-volatile EEPROM 15 with a set of default values that are stored in ROM 19. The register function 17 is then set to "UNPRG" for unprogrammed.

By using five (5) bytes, the probability that the non-volatile memory's random contends will match the known state, thereby leading to an erroneous conclusion, is small. Particularly, with the five (5) bytes, the odds of a match randomly occurring are 1099511627776:1.

To return the register 13 to the default values, the present invention provides a means for manual initialization so that the default values will be programmed into the EEPROM 15. The manual initialization is followed by self-programming of the default values into the EEPROM 15 and is referred to herein as the register reset.

To manually initiate register reset in accordance with one embodiment of the present invention, the three switches 14 A-C are pressed in unison for a period of time greater than fifteen (15) seconds. When this occurs, the micro-controller 16 changes the register function 17 to a value (RESET) that does not match the pre-stored values such as values assigned to time-of-use and demand and demand only modes of operation.

When the register initialization function is executed, there will not be a match between the pre-stored value and the register function 17. When there is no match, then the default values are used for the programmable register values.

A common reason for resetting a register 13 is when the register password is lost or forgotten. Each register has a password to provide security against unauthorized access. Once a user forgets a password, access to change the password cannot be provided until either the user remembers the password, finds the password by trial and error, or resets the register 13 to default values. The password, of course, is one of the programmable register parameters.

Since resetting the register 13 provides a means for access to the register 13 without knowing the password, it is advantageous to know if a reset has occurred. Therefore, the number of EEPROM writes is not reset by the register reset. The means by which is this accomplished is by changing the register function 17 to a state unrecognized by the initialization check but recognizable by the routine which downloads the default values. When the default values are downloaded for the first time after manufacture, the register function 17 is unrecognizable to both the initialization sequence and the routine which downloads the default values. When the routine which downloads the default values does not recognize the value of the register function 17, it resets the number of EEPROM writes to zero. After a register reset, the initialization sequence will not recognize the register function 17, so it will cause the default values to be downloaded, but the routine which downloads the default values will recognize the register function 17, so even though it downloads all of the other default values it will not reset the number of EEPROM writes to zero. Thus the number of EEPROM writes will always be accurate even if the register 13 is reset.

Figure 3:
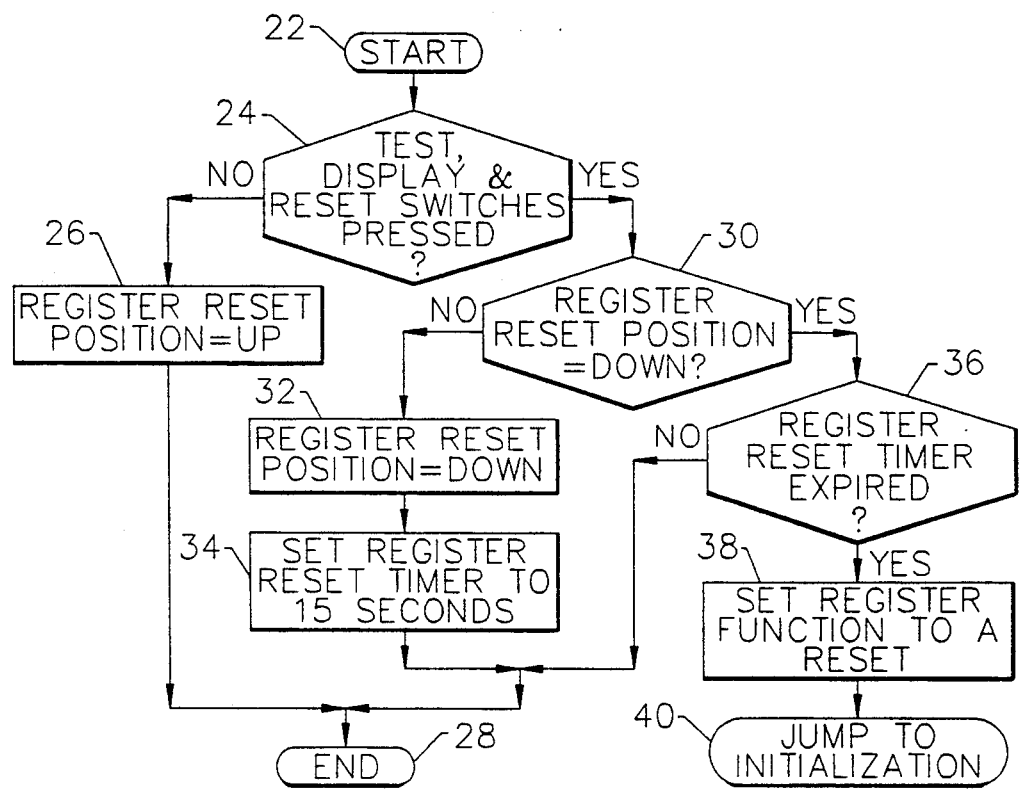
FIG. 3 is a flow chart illustrating process steps in accordance with one embodiment of the present invention.

FIG. 3 is a flow chart 20 illustrating process steps in accordance with one embodiment of the present invention. Subsequent to starting operations as indicated at a start legend 22, the first test is to determine whether the test, display and reset switches are pressed as indicated at a step 24. If the switches are not pressed, then the register reset position is set to UP as indicated at step 26 and operations then end as indicated at an end legend 28. If the switches are pressed, then the next step 30 is to determine whether the register reset position is DOWN. If the register reset position is not down, then the register reset position is set to DOWN as indicated at step 32 and the register reset timer is set to fifteen (15) seconds as indicated at step 34. Operations then end as indicated at step 28.

If the register reset position is DOWN, then the next step 36 is to determine whether the register reset timer has expired, i.e., timed-out, as indicated at a step 36. If the register reset timer has not expired, then operations end as indicated at end legend 28. If, however, the register reset timer has expired, then the register function 17 is set to RESET as indicated at step 38. The system then proceeds to the initialization task as indicated at step 40.

A pseudo code explanation of the present algorithm is provided in Appendix A.

While the present invention has been described with respect to specific embodiments, many modifications, variations, substitutions, and equivalents will be apparent to those skilled in the art. Accordingly, the invention is to be considered as limited only by the spirit and scope of the appended claims.

---

APPENDIX A
COPYRIGHT (C) 1990 GENERAL ELECTRIC COMPANY

```
PERFORM param_pgm_task()
    IF display, test, and reset switches are pressed
        IF reg_reset_position = UP
            set register_reset_counter to 15 seconds
            reg_reset_position = DOWN
        ELSE
            IF register_reset_counter = 0
                ...
                write "RESET" to register_function in EEPROM
                ...
                JUMP TO low_level_initialization
            ENDIF
        ENDIF
    ELSE
        reg_reset_position = UP
    ENDIF
END param_pgm_task
PERFORM low_level_initialization()
    ...
    ...
    ...
    reg_func = perform get_register_function()
    IF reg_func = TOU_DEMAND
        ...
        ...
    ELSE
        IF (reg_func <> DEMAND_ONLY)
        AND (reg_func <> UNPROG)
            ...
            perform download_default_values(mem_size)
            ...
        ENDIF /* reg_func <> DEMAND_ONLY */
    ENDIF /* reg_func = TOU_AND_DEMAND */
    ...
    ...
    ...
END low_level_initialization
PERFORM download_default_values(ram_size)
    ...
    IF register_function = "RESET"
        ...
        write default values to EEPROM power fail except
        number_eeprom_writes
        IF number_eeprom_writes <> MAX_NUM_WRITES
            ...
            number_eeprom_writes = number_eeprom_writes +
            1
        ENDIF
        write number_eeprom_writes to EEPROM
    ELSE
        ...
        write all default values to EEPROM power fail area
    ENDIF
    write all default values to EEPROM power fail area
    ...
    ...
    write "UNPRG" to register_function bytes
    update EEPROM checksums
    ...
END download_default_values
```

What is claimed is:

1. A solid-state electronic register for an electrical energy meter, comprising:
    non-volatile memory means having a register function portion;
    read-only memory means for retaining predetermined operating parameters, such as time-of-use and demand operating parameters, demand-only operating parameters and default operating parameters; and
    controller means, responsive to an application of power to said register, for disposing said register in a mode of operation, such as a time-of-use and demand mode of operation, a demand-only mode of operation and a default mode of operation, using said corresponding predetermined operating parameters, said controller means comprising initialization means and register reset means, wherein said initialization means is responsive to a first application of power to said register and is responsive to activation by said register reset means, and comprises means for self-programming said register into a default mode of operation upon a first application of power to said register, by comparing said register function portion to respective ones of said predetermined operating parameters and by downloading said default operating parameters from said read-only memory means to said non-volatile memory means, based on a mismatch between said register function portion and said respective ones of said predetermined operating parameters, and wherein said register reset means is responsive to actuation by a user comprises means for disposing said register in a default mode of operation by resetting said register function portion to a reset value, which does not match any of said respective ones of said predetermined operating parameters, and then by activating said initialization means.

2. The solid-state electronic register of claim 1, wherein said initialization means is further responsive to a subsequent application of power to said register, and further comprises means for automatically disposing said register in a mode of operation identical to a most recent mode of operation, which occurred prior to said subsequent application of power to said register, without intervention by the user.

3. The solid-state electronic register of claim 2, wherein said non-volatile memory means further comprises an EEPROM writes portion for retaining a value corresponding to the number of times said respective ones of said predetermined operating parameters have been downloaded from said read-only memory means to said non-volatile memory means.

4. The solid-state electronic register of claim 3, wherein said EEPROM writes portion is numerically incremented in response to every application of power to said register, thereby indicating the number of times power has been applied to said register.

5. The solid-state electronic register of claim 4, wherein said EEPROM writes portion is also numerically incremented in response to every actuation of said register reset means by the user.

6. A solid-state electronic register for an electrical energy meter, comprising:

read-only memory means for retaining predetermined operating parameters such as default operating parameters, time-of-use and demand operating parameters and demand-only operating parameters, respectively corresponding to a default mode, a time-of-use and demand mode, and a demand-only mode of operation of said register;

non-volatile memory means for retaining either of said predetermined default operating parameters, said time-of-use and demand operating parameters, or said demand-only operating parameters based on a respective user-selected mode of operation of said register, and means for retaining said predetermined default operating parameters based on a self-programmed mode of operation of said register; and controller means, responsive to an application of power to said register, for disposing said register in either of the user-selected modes of operation, and for disposing said register in said self-programmed mode of operation, said controller means comprising initialization means and register reset means, wherein said initialization means is responsive to a first application of power to said register and is responsive to activation by said register reset means, and comprises means, connected to said read-only memory means and said non-volatile memory means, for self-programming said register into said default mode of operation, based upon a first application of power to said register, and wherein said register reset means is responsive to actuation by a user and comprises means for activating said initialization means and for disposing said register into said default mode of operation.

7. The solid-state electronic register of claim 6, wherein said initialization means is further responsive to a subsequent application of power to said register, and further comprises means for automatically disposing said register in a mode of operation identical to a most recent mode of operation, which occurred prior to said subsequent application to power to said register, without intervention by the user.

8. The solid-state electronic register of claim 7, wherein said non-volatile memory means comprises an EEPROM writes portion for retaining a value corresponding to the number of times said register has been disposed into a user-selected mode of operation and into a self-programmed mode of operation.

9. The solid-state electronic register of claim 8, wherein said EEPROM writes portion is numerically incremented in response to every application of power to said register, thereby indicating the number of times power has been applied to said register.

10. The solid-state electronic register of claim 9, wherein said EEPROM writes portion is also numerically incremented in response to every actuation of said register reset means by the user.

11. A method for programming a solid-state electronic register for an electrical energy meter, comprising the steps of:

providing power to said register;

initializing said register in one of a plurality of modes of operation, such as a time-of-use and demand mode of operation, a demand-only mode of operation and a default mode of operation, said initializing step comprising the steps of:

comparing a register function portion of non-volatile memory in said register to respective ones of a plurality of predetermined programmable parameters retained by said register;

disposing said register in a default mode of operation if the results of said comparing step indicate a mismatch between said register function portion and said respective ones of said predetermined programmable parameters; and disposing said register in a mode of operation defined by said register function portion if said register function portion matches one of said respective ones of said predetermined programmable operating parameters.

12. The method of claim 11, wherein said default mode disposing step comprises the steps of:

downloading predetermined default parameters from a read-only memory in said register; and programmable said predetermined default parameters into said non-volatile memory.

13. The method of claim 12, wherein said comparing step is preceded by the steps of:

providing a reset control signal; and resetting said register function portion to a reset value, which does not match any of said respective ones of said predetermined operating parameters, in response to said reset control signal.

14. The method of claim 13, further comprising the step of updating an EEPROM writes portion of said non-volatile memory to indicate, in part, the number of times power has been applied to said register.